(12) United States Patent
Kaneko et al.

(10) Patent No.: US 6,916,590 B2
(45) Date of Patent: Jul. 12, 2005

(54) RESIST COMPOSITION

(75) Inventors: Isamu Kaneko, Kanagawa (JP); Yoko Takebe, Kanagawa (JP); Shun-ichi Kodama, Kanagawa (JP)

(73) Assignee: Asahi Glass Company, Limited, Tokyo (JP)

(*) Notice: Subject to any disclaimer, the term of this patent is extended or adjusted under 35 U.S.C. 154(b) by 71 days.

(21) Appl. No.: 10/322,665

(22) Filed: Dec. 19, 2002

(65) Prior Publication Data

US 2003/0148213 A1 Aug. 7, 2003

Related U.S. Application Data

(63) Continuation of application No. PCT/JP01/05311, filed on Jun. 21, 2001.

(30) Foreign Application Priority Data

Jun. 21, 2000 (JP) ................................. 2000-185608
Nov. 30, 2000 (JP) ................................. 2000-364489

(51) Int. Cl.$^7$ ............................................. G03F 7/004
(52) U.S. Cl. ..................... 430/270.1; 430/905; 430/907
(58) Field of Search ........................ 430/270.1, 281.1, 430/905, 907

(56) References Cited

U.S. PATENT DOCUMENTS 6,468,712 B1    10/2002    Fedynyshyn
6,815,146 B2 *  11/2004    Okada et al. ............ 430/270.1
2002/0051940 A1 *  5/2002    Lee et al.
2002/0146638 A1 * 10/2002    Ito et al. .................. 430/270.1
2002/0146639 A1 * 10/2002    Brock et al.
2003/0027077 A1 *  2/2003    Zampini et al.

FOREIGN PATENT DOCUMENTS

| JP | 63-238115 | 10/1988 |
|---|---|---|
| JP | 2001-133979 | 5/2001 |
| JP | 2001-154362 | 6/2001 |
| WO | WO 00/17712 | 3/2000 |
| WO | WO 00/67072 | 11/2000 |

* cited by examiner

*Primary Examiner*—Rosemary E. Ashton
(74) *Attorney, Agent, or Firm*—Oblon, Spivak, McClelland, Maier & Neustadt, P.C.

(57) ABSTRACT

The following resist composition which is excellent particularly in transparency to light beams and dry etching properties and gives a resist pattern excellent in sensitivity, resolution, evenness, heat resistance, etc., as a chemical amplification type resist, is presented. A resist composition which comprises a fluoropolymer (A) having repeating units represented by a structure formed by the cyclopolymerization of one molecule of a fluorinated diene and one molecule of a monoene, in which the monoene unit in each repeating unit has a blocked acid group capable of regenerating the acid group by the action of an acid, an acid-generating compound (B) which generates an acid upon irradiation with light, and an organic solvent (C).

10 Claims, No Drawings

RESIST COMPOSITION

TECHNICAL FIELD

The present invention relates to a novel resist composition containing a fluoropolymer. More particularly, it relates to a chemical amplification type resist composition useful for fine processing employing various light beams, such as far ultraviolet rays such as KrF laser or ArF laser, vacuum ultraviolet rays such as $F_2$ laser, or X-rays.

BACKGROUND ART

In recent years, along with the progress in fine circuit patterns in the process for producing semiconductor integrated circuits, a photoresist material having high resolution and high sensitivity is desired. As the circuit patterns become fine, a short wavelength of a light source for an exposure apparatus becomes essential. In an application to lithography employing an excimer laser of 250 nm or shorter, a polyvinyl phenol type resin, an alicyclic acrylic type resin or a polynorbornane type resin has, for example, been proposed, but no adequate resolution and sensitivity have been obtained.

It is an object of the present invention to provide a resist composition which is particularly excellent in transparency to light beams having wavelengths of at most 200 nm and dry etching properties, as a chemical amplification type resist and which gives a resist pattern excellent in sensitivity, resolution, evenness, heat resistance, etc.

DISCLOSURE OF THE INVENTION

The present invention is the following invention which has been made to solve the above-described problems.

A resist composition which comprises a fluoropolymer (A) having repeating units represented by a structure formed by the cyclopolymerization of one molecule of a fluorinated diene and one molecule of a monoene, in which the monoene unit in each repeating unit has a blocked acid group capable of regenerating the acid group by the action of an acid, an acid-generating compound (B) which generates an acid upon irradiation with light, and an organic solvent (C).

The above blocked acid group is preferably a 1-hydroxy-1-trifluoromethyl-2,2,2-trifluoroethyl group having the hydroxyl group-blocked, or a 1-hydroxy-1-methyl-2,2,2-trifluoroethyl group having the hydroxyl group blocked. Further, the above blocked acid group is also preferably a blocked hydroxyl group bonded directly to a carbon atom derived from the polymerizable unsaturated group of the monoene.

Further, the above fluorinated diene is preferably a compound represented by the formula (1):

$$CF_2=CF-X-CF=CF_2 \quad (1)$$

wherein X is a bivalent atom such as an oxygen atom, or a $C_{1-3}$ perfluoroalkylene group.

Further, the above monoene is preferably a vinyl compound represented by $CH_2=CH-Y$ (wherein Y is a monovalent organic group having a blocked acid group or a group which can be converted to a blocked acid group, or a blocked acid group or a group which can be converted to a blocked acid).

BEST MODE FOR CARRYING OUT THE INVENTION

Now, the composition of the present invention will be described in detail.

The fluoropolymer (A) contains, as an essential partial structure, repeating units represented by a structure formed by the cyclopolymerization of one molecule of a fluorinated diene (hereinafter referred to also as a monomer (a)) and one molecule of a monoene having a blocked acid group capable of regenerating the acid group by the action of an acid or a monoene having a group (hereinafter referred to as a precursor group) which can be converted to a blocked acid group (such a monomer may hereinafter be referred to also as a monomer (b)). Such cyclopolymerization may also be called two molecule cyclopolymerization. For example, by the cyclopolymerization of the monomer (a) represented by $CF_2=CF-X-CF=CF_2$ which will be described later and the monomer (b) represented by $CH_2=CH-Y$ which will be described later, a repeating unit having a structure shown by the following formula (2) will be formed.

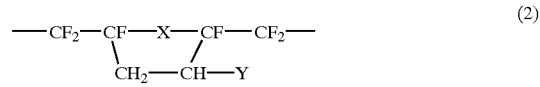

(2)

By the cyclopolymerization of the monomer (a)/the monomer (b), an alternating polymerization polymer comprising the above repeating units and monomer units made solely of the monomer (b), is likely to form. Namely, a polymer having the monomer (a)/the monomer (b) polymerized in a molar ratio of 1/2, is likely to form. If the monomer (a) is in excess of this molar ratio of 1/2, monomer units having the excess monomer (a) 1,2-polymerized, are likely to form. If the monomer (b) is in excess of this molar ratio of 1/2, a polymer comprising the above repeating units and blocks having at least two monomer units solely of the monomer (b) chained, will form. It is relatively difficult to obtain a polymer composed solely of the repeating units of the above formula (2).

A monomer unit formed by the polymerization reaction of the monomer (a) will be hereinafter referred to as a monomer unit (a). Likewise, a monomer unit of the monomer (b) will be hereinafter referred to as a monomer unit (b). The above repeating unit is a unit containing one monomer unit (a) and one monomer unit (b).

Methods for introducing the partial structure of a blocked acid group capable of regenerating the acid group by the action of an acid, which is present in the repeating unit having a cyclic structure as shown by the formula (2) formed by the cyclopolymerization of one molecule of the fluorinated diene and one molecule of the monoene, may be generally classified into a direct method and an indirect method. In the following, "the blocked acid group" means a blocked acid group capable of regenerating the acid group by the action of an acid, and "the blocked hydroxyl group" means a blocked hydroxyl group capable of regenerating the hydroxyl group by an action of an acid.

Here, the direct method is a method wherein the monoene (the monomer (b)) having a blocked acid group capable of regenerating the acid group by the action of an acid, is used directly for the cyclopolymerization.

Whereas, the indirect method is a method wherein the monomer (a) and a monomer (b) having a precursor group are subjected to cyclopolymerization, and the precursor group of the obtained polymer, is converted to a blocked acid group, to obtain the fluoropolymer (A). For example, it is a method wherein the monomer (a) and vinyl carboxylate are subjected to cyclopolymerization, the obtained polymer is subjected to a hydrolytic reaction, and then hydroxyl groups formed in the polymer are blocked with groups capable of regenerating the hydroxyl groups by an action of an acid, to produce a fluoropolymer (A) having blocked hydroxyl groups (acid groups).

The fluorinated diene (the monomer (a)) is a fluorine compound having two polymerizable unsaturated groups. The two polymerizable unsaturated groups are preferably present at both terminals of the molecule, and the two polymerizable unsaturated groups are preferably trifluorovinyl groups, respectively. Further, the fluorinated diene is preferably a perfluoro compound. Two or more fluorinated dienes may be used in combination.

As the fluorinated diene, a compound represented by the following formula (1) is preferred:

$$CF_2=CF-X-CF=CF_2 \qquad (1)$$

wherein X is a bivalent atom such as an oxygen atom, or a $C_{1-3}$ perfluoroalkylene group.

As the compound represented by the formula (1), a compound represented by the following formula (1-1) or (1-2) is particularly preferred. Further, some of fluorine atoms in the compound represented by the formula (1) may be substituted by hydrogen atoms or may be substituted by halogen atoms other than fluorine atoms (particularly chlorine atoms).

$$CF_2=CFCF_2CF=CF_2 \qquad (1\text{-}1)$$

$$CF_2=CFOCF=CF_2 \qquad (1\text{-}2)$$

The monoene (the monomer (b)) is a compound having one polymerizable unsaturated group, and it may have a fluorine atom. The polymerizable unsaturated group is preferably a vinyl group ($CH_2=CH-$), a vinylidene group ($CH_2=C=$) or a vinylene group ($-CH=CH-$). In the case of a compound having a fluorine atom, it is preferred that the polymerizable unsaturated group has no fluorine atom. Two or more types of the monomer (b) may be used in combination.

As the monoene, a vinyl compound represented by the following formula is preferred. However, a monoene other than the compound represented by the following formula, such as the after-mentioned vinylene carbonate, may also be used.

$$CH_2=CH-Y$$

Y is a monovalent organic group having a blocked acid group or a group (a precursor group) which can be converted to a blocked acid group, or a blocked acid group or a group (a precursor group) which can be converted to a blocked acid group. Here, in a case where Y is a blocked acid group itself, such a blocked acid group may, for example, be a blocked carboxylic acid group. In a case where Y is a hydroxyl group, such a hydroxyl group exhibits acidity as described hereinafter, and such a hydroxyl group is an acid group for the purpose of the present invention. For example, in a case where Y is a blocked hydroxyl group itself, its specific example may be a tert-alkyloxy group in the after-mentioned tert-alkyl vinyl ether. In a case where it is a precursor which can be converted to a blocked hydroxyl group, its specific example may be an acyloxy group in the after-mentioned vinyl carboxylate. Here, the acyloxy group or the like may be used as the above precursor group or as the blocked hydroxyl group.

The acid group in the blocked acid group in the fluoropolymer (A), may, for example, be a carboxylic acid group, a sulfonic acid group, a hydroxyl group bonded to a carbon atom having two perfluoroalkyl groups or alkyl groups bonded, a hydroxyl group in the after-mentioned polymer, or a hydroxyl group bonded to an aryl group. Preferred acid groups are a carboxylic acid group, a hydroxyl group bonded to a carbon atom having two trifluoromethyl groups bonded, a hydroxyl group bonded to a carbon atom having a trifluoromethyl group and a methyl group bonded, a hydroxyl group in the after-mentioned polymer, and a hydroxyl group bonded to a phenyl group. Such an aryl group or a phenyl group may have a substituent, and as such a substituent, a halogen atom, particularly a fluorine atom, is preferred. A hydroxyl group bonded to a carbon atom having two trifluoromethyl group bonded thereto (i.e. a hydroxyl group of a 1-hydroxy-1-trifluoromethyl-2,2,2-trifluoroethyl group), a hydroxy group bonded to a carbon atom having one trifluoromethyl group and one methyl group bonded thereto (i.e. a hydroxyl group of a 1-hydroxy-1-methyl-2,2,2-trifluoroethyl group) and a hydroxyl group bonded to a phenyl group, are particularly preferred acid groups in the present invention.

The blocked acid groups in the fluoropolymer (A) will be derived from the monomer (b). For example, the fluoropolymer (A) can be obtained by a method wherein an acid group-containing monomer is polymerized with the monomer (a) and then the acid groups are blocked, or a method wherein the acid group of an acid group-containing monomer is preliminarily blocked and then polymerized with the monomer (a). As the acid group-containing monomer, a compound represented by the following formula (3) is preferred.

$$CH_2=C(R^1)-(O)_k-R^2\text{-}Z \qquad (3)$$

In the formula (3), $R^1$ is a hydrogen atom or an alkyl group having at most 3 carbon atoms, $R^2$ is a single bond or an alkylene group having at most 8 carbon atoms, Z is a carboxylic acid group, a 1-hydroxy-1-trifluoromethyl-2,2,2-trifluoroethyl group, a 1-hydroxy-1-methyl-2,2,2-trifluoroethyl group or a hydroxyphenyl group having one or more (preferably from 3 to 4) fluorine atoms bonded thereto, and k is 0 or 1. $R^1$ is particularly preferably a hydrogen atom.

The following compounds may, for example, be mentioned as monomers represented by the above formula (3) or other monomers having acid groups. In the following formulae, $Ph^{3F}$ is a trifluorophenylene group, and $Ph^{4F}$ is a tetrafluorophenylene group, whereby the hydroxyl group bonded thereto is present at the 4-position. m is an integer of from 2 to 6, n is an integer of from 0 to 8, and p is an integer of from 0 to 10.

$$CH_2=CH-(CH_2)_n-C(CF_3)_2OH$$

$$CH_2=CH-O(CH_2)_m-C(CF_3)_2OH$$

$$CH_2=CH-(CH_2)_n-C(CH_3)(CF_3)OH$$

$$CH_2=CH-O(CH_2)_m-C(CH_3)(CF_3)OH$$

$$CH_2=CH-(CH_2)_n\text{-}Ph^{3F}\text{-}OH$$

$$CH_2=CH-(CH_2)_n\text{-}Ph^{4F}\text{-}OH$$

$$CH_2=C(CH_3)-(CH_2)_n\text{-}Ph^{3F}\text{-}OH$$

$$CH_2=C(CH_3)-(CH_2)_n\text{-}Ph^{4F}\text{-}OH$$

$$CH_2=C(C_2H_5)-(CH_2)_n\text{-}Ph^{3F}\text{-}OH$$

$$CH_2=C(C_2H_5)-(CH_2)_n\text{-}Ph^{4F}\text{-}OH$$

$$CH_2=CH-(CH_2)_p-COOH$$

Other monomers having acid groups include, for example, a cyclic monomer having an acid group, such as norbornene having a 1-hydroxy-1-trifluoromethyl-2,2,2-trifluoroethyl group bonded thereto, and an unsaturated carboxylic acid other than the above, such as methacrylic acid.

In the above-mentioned direct method, a monoene having such an acid group preliminarily converted to a blocked acid group capable of regenerating the acid group by the action of an acid, is used as the monomer (b) for the cyclopolymerization. Further, in the above-mentioned indirect method, a monoene having such an acid group not blocked, is used as the monomer (b) for the cyclopolymerization, and then the acid group is converted to a blocked acid group capable of regenerating the acid group by the action of an acid, by a suitable blocking method including the after-mentioned method.

Further, as an indirect method, there is a method for producing the fluoropolymer (A) by using a monomer (b) which can be converted to an acid group other than the above-mentioned acid group. This monomer (b) is a monoene having a precursor group which can be converted to a hydroxyl group, and the hydroxyl group derived from the precursor group is a hydroxyl group other than the above-mentioned hydroxyl group inherently showing acidity, and is a hydroxyl group showing acidity in the fluoropolymer (A). As such a monoene, a vinyl carboxylate or vinylene carbonate may, for example, be mentioned.

For example, hydroxyl groups in a polymer formed by hydrolysis from a polymer having monomer units of vinyl carboxylate, usually do not show acidity, but in a case where a carbon atom having a fluorine atom bonded thereto, is present in the vicinity of the carbon atom having the hydroxyl group bonded thereto, such a hydroxyl group shows acidity. Accordingly, in a case where Y of a monomer (b) represented by $CH_2=CH-Y$, is a monovalent group which can be converted to a hydroxyl group, if the carbon atom having the formed hydroxyl group bonded thereto is adjacent to a carbon atom having a fluorine atom bonded thereto, in the main chain of the polymer (see the chemical structure of the repeating unit shown by the above formula (2)), such a hydroxyl group shows acidity. Therefore, in a case where the monomer (b) is a monomer having a precursor group such as an acyloxy group, such a monomer is preferably a compound having a hydroxyl group bonded to a carbon atom of a polymerizable unsaturated group. Namely, as a preferred example of the blocked acid group in the fluoropolymer (A), a blocked hydroxyl group bonded directly to a carbon atom derived from a polymerizable unsaturated group of a monoene, may be mentioned. Accordingly, as such a monomer (b), a vinyl carboxylate or vinylene carbonate is preferred. As the vinyl carboxylate, a vinyl carboxylate having an acyloxy group having at most 5 carbon atoms, which is highly hydrolysable, is particularly preferred, and vinyl acetate is especially preferred.

Structures listed below, are preferred as the structure of a blocked acid group capable of regenerating the acid group by the action of an acid, which can be preliminarily present in the monomer (b). These structures for the blocked acid group are also preferred as the structures for the blocked acid group converted finally by the above indirect method.

As such a structure for the blocked acid group, a structure having the hydrogen atom of a hydroxyl group substituted by e.g. an alkyl group, an alkoxycarbonyl group, an acyl group or a cyclic ether group, may be mentioned. As a preferred alkyl group for substitution of the hydrogen atom of a hydroxyl group, a $C_{1-6}$ alkyl group which may have a substituent (such as an aryl group or an alkoxy group) may be mentioned. As a specific example of such an alkyl group, an alkyl group having at most 6 carbon atoms (such as a tert-butyl group), an aryl-substituted alkyl group having a total carbon number of from 7 to 20 (such as a benzyl group, a triphenylmethyl group, a p-methoxybenzyl group or a 3,4-dimethoxybenzyl group), an alkoxyalkyl group having a total carbon number of at most 8 (such as a methoxymethyl group, a (2-methoxyethoxy)methyl group, or a benzyloxymethyl group) may be mentioned. As a preferred alkoxycarbonyl group for substitution for the hydrogen atom of a hydroxyl group, an alkoxycarbonyl group having a total carbon number of at most 8 may be mentioned, and a tert-butoxy carbonyl group may, for example, be mentioned. As a preferred acyl group for substitution of the hydrogen atom of a hydroxyl group, an acyl group having a total carbon number of at most 8 may be mentioned, and a pivaloyl group, a benzoyl group or an acetyl group may, for example, be mentioned. As a preferred cyclic ether group for substitution of the hydrogen atom of a hydroxyl group, a 2-tetrahydropyranyl group may, for example, be mentioned.

In order to block a hydroxyl group with a group capable of regenerating the hydroxyl group by the action of an acid, an alcohol, a carboxylic acid or an active derivative thereof is reacted. As such an active derivative, an alkyl halide, an acid chloride, an acid anhydride, a chlorocarbonate, a dialkyl dicarbonate (such as di-tert-butyl carbonate) or 3,4-dihydro-2H-pyran may, for example, be mentioned. Specific examples of the reagent useful for blocking a hydroxyl group, are disclosed in Handbook of Reagents for Organic Synthesis: Activating Agents and Protecting Groups, John Wiley & Sons (1999) compiled by A. J. Pearson and W. R. Roush.

An acetal may also be mentioned as a structure in which two hydroxyl groups substituted on adjacent carbon atoms, obtainable by hydrolysis after the cyclopolymerization using vinylene carbonate as the monomer (b), are blocked by a group capable of regenerating the hydroxyl groups by the action of an acid. As a partial structure of such an acetal, a structure may be mentioned in which the two hydrogen atoms of the two hydroxyl groups are substituted by e.g. a benzylidene group, an isopropylidene group, a cyclohexylidene group, a cyclopentylidene group or a di-tert-butyl silylene group.

As mentioned above, in a case where Y of the monomer (b) represented by $CH_2=CH-Y$ is a monovalent group which can form a hydroxyl group, the resulting hydroxyl group may show acidity in the fluoropolymer. In a case where Y is a blocked hydroxyl group capable of regenerating the acid group by the action of an acid, a fluoropolymer (A) will be obtained directly by the cyclopolymerization of this monomer (b) and a fluorinated diene. As such a monomer (b), a tert-alkyl vinyl ether, i.e. a compound having a tert-alkyl group and a vinyl group bonded via an oxygen atom, may be mentioned.

As such a tert-alkyl group, a tert-alkyl group wherein the three alkyl groups bonded to the tertiary carbon atom have at most two carbon atoms, respectively, is preferred. For example, $-C(CH_3)_3$, $-C(C_2H_5)_3$, $-C(CH_3)_2(C_2H_5)$, or $-C(CH_3)(C_2H_5)_2$ is preferred. A particularly preferred monomer (b) is tert-butyl vinyl ether.

The tert-alkoxy group in the fluoropolymer (A) obtained by using the above monomer (b) is capable of regenerating the hydroxyl group by the action of an acid, and the resulting hydroxyl group shows acidity. The alkyl group moiety of the tert-alkoxy group will usually be detached in the form of an olefin. For example, from a tert-butoxy group, isobutylene will be formed. The lower the boiling point of the resulting olefin, the easier the removal of the by-product (the olefin in this case) from the system of the resist composition used.

The tert-butyl vinyl ether is preferred to other tert-alkyl vinyl ethers, since the boiling point of the resulting olefin is low. Further, the fluoropolymer (A) obtained by copolymerizing the tert-butyl vinyl ether, is advantageous in that as compared with other fluoropolymers (A), removal of the by-product from the system of the resist composition used, is easy.

The fluoropolymer (A) may contain monomer units of a copolymerizable monomer, preferably a radical polymerizable monomer, other than the monomer units (a) and the monomer units (b). The proportion of such other monomer units is preferably at most 15 mol %, based on the total monomer units.

In the fluoropolymer (A), the molar ratio of the monomer units (a) to the monomer units (b) is preferably such that monomer units (a)/monomer units (b)=25 to 50/75 to 50. If the proportion of the monomer units (a) is smaller than this, the light transmittance tends to decrease, and if the proportion of the monomer units (b) is smaller than this, or if the proportion of the monomer units (a) is higher than this, the developability tends to decrease.

The molecular weight of the fluoropolymer (A) is not particularly limited so long as it is uniformly dissolved in the after-mentioned organic solvent and can be uniformly coated on a substrate. Usually, its number average molecular weight as calculated as polystyrene is suitably from 1,000 to 100,000, preferably from 2,000 to 20,000. If the number average molecular weight is less than 1,000, problems are likely to result, such that the obtainable resist pattern tends to be defective, the film remaining ratio after the development tends to decrease, and the dimensional stability during the heat treatment of the pattern tends to be low. On the other hand, if the number average molecular weight exceeds 100,000, the coating property of the composition is likely to deteriorate, or the developability may decrease.

The fluoropolymer (A) can be obtained by copolymerizing the prescribed proportions of the above-mentioned monomers under a polymerization initiating source. As the polymerization initiating source, there will be no limitation, when the polymerization reaction is proceeded radically. For example, a radical-generating agent, light or ionizing radiation may be mentioned. Particularly preferred is a radical-generating agent, such as a peroxide, an azo compound or a persulfate.

The polymerization method is also not particularly limited, and so-called bulk polymerization in which monomers are subjected to polymerization as they are, solution polymerization which is carried out in a fluorohydrocarbon, a chlorohydrocarbon, a fluorinated chlorohydrocarbon, an alcohol, a hydrocarbon or other organic solvent, capable of dissolving the monomers, suspension polymerization which is carried out in an aqueous medium in the absence or presence of a suitable organic solvent, or emulsion polymerization which is carried out by adding an emulsifier to an aqueous medium, may, for example, be mentioned.

The temperature and the pressure for the polymerization are also not particularly limited. However, the temperature is preferably set within a range of from 0 to 200° C., particularly preferably from room temperature to 100° C. The pressure is preferably within a range of at most 10 MPa, particularly preferably within a range of at most 3 MPa.

As the acid-generating compound (B) which generates an acid upon irradiation with light, it is possible to employ an acid-generating compound which is commonly used for a chemical amplification type resist material. Namely, an onium salt such as a diaryl iodonium salt, a triaryl sulfonium salt, an aryl phenyl diazonium salt or a trialkyl sulfonium salt, or a trichloromethyl-s-triazine may, for example, be mentioned.

The organic solvent of component (C) is not particularly limited, so long as it is capable of dissolving both components (A) and (B). An alcohol such as methyl alcohol or ethyl alcohol, a ketone such as acetone, methyl isobutyl ketone or cyclohexanone, an acetate such as ethyl acetate or butyl acetate, an aromatic hydrocarbon such as toluene or xylene, a glycol monoalkyl ether such as propylene glycol monomethyl ether or propylene glycol monoethyl ether, or a glycol monoalkyl ether ester such as propylene glycol monomethyl ether acetate or carbitol acetate, may, for example, be mentioned.

The proportions of the respective components in the resist composition of the present invention are usually such that per 100 parts by mass of the fluoropolymer (A), the acid-generating compound (B) is from 0.1 to 20 parts by mass, and the organic solvent (C) is from 50 to 2,000 parts by mass. Preferably, per 100 parts by mass of the fluoropolymer (A), the acid-generating compound (B) is from 0.1 to 10 parts by mass, and the organic solvent (C) is from 100 to 1,000 parts by mass.

To the resist composition of the present invention, a surfactant to improve the coating property, a nitrogen-containing basic compound to adjust the acid-generating pattern, and an adhesion-assisting agent to improve the adhesion to the substrate or a storage stabilizer to increase the storage stability of the composition, may, for example, be optionally incorporated. Further, the resist composition of the present invention is preferably employed in such a manner that the respective components are uniformly mixed, followed by filtration by means of a filter of from 0.2 to 2 μm.

The resist composition of the present invention is coated on a substrate such as a silicone wafer, followed by drying to form a resist film. As the coating method, spin coating, cast coating or roll coating may, for example, be employed. The formed resist film will be irradiated with light via a mask having a pattern drawn thereon, followed by development treatment to form the pattern.

The light beams for the irradiation may, for example, be ultraviolet rays such as g-line having a wavelength of 436 nm or i-line having a wavelength of 365 nm, far ultraviolet rays or vacuum ultraviolet rays, such as KrF laser having a wavelength of 248 mm or $F_2$ laser having a wavelength of 157 nm, or X-rays. The resist composition of the present invention is a resist composition useful particularly for an application where ultraviolet rays having a wavelength of at most 200 nm (such as ArF laser or $F_2$ laser; such will be hereinafter referred to as short wavelength ultraviolet rays) are used as the light source.

As the development treatment solution, various alkali aqueous solutions are employed. Specifically, sodium hydroxide, potassium hydroxide, ammonium hydroxide, tetramethyl ammonium hydroxide and triethylamine may, for example, be mentioned.

EXAMPLES

Now, the present invention will be described in further detail with reference to Examples, but the present invention is by no means restricted to these Examples. Firstly, prior to Examples, Preparation Examples of polymers used in the present invention will be shown. Here, R113 represents triclhlorotrifluoroethane (organic solvent), and TFE represents polytetrafluoroethylene.

Preparation Example 1

Into a deaerated stainless steel autoclave having an internal capacity of 0.2 l and equipped with a stirrer, 150 g of R113 was charged, and 23.6 g of $CF_2$=$CFCF_2CF$=$CF_2$ (hereinafter referred to simply as monomer 1), 25.2 g of $CH_2$=$CHCH_2C(CF_3)_2OCOC(CH_3)_3$ (hereinafter referred to simply as monomer 2) and 10 ml of a solution containing 10 mass % of diisopropylperoxy dicarbonate in R113, were introduced, whereupon the temperature was raised to 40° C. to initiate the polymerization. After the reaction for 5 hours, the autoclave was cooled to room temperature, and then, the polymer solution was taken out. The obtained polymer solution was put into methanol to precipitate the polymer, which was washed and then vacuum-dried at 50° C. to obtain 7.5 g of a fluoropolymer.

The composition of the obtained polymer was such that monomer 1 units/monomer 2 units=35/65 (mol %). The molecular weight of the obtained polymer was measured by GPC, whereby the number average molecular weight as calculated as polystyrene was 5200.

Preparation Example 2

Into a deaerated stainless steel autoclave having an internal capacity of 0.2 l and equipped with a stirrer, 150 g of R113 was charged, and 41.0 g of $CF_2$=$CFOCF$=$CF_2$ (hereinafter referred to simply as monomer 3), 25.2 g of $CH_2$=$CHCH_2C(CF_3)(CH_3)OCOC(CH_3)_3$ (hereinafter referred to simply as monomer 4) and 10 ml of a solution containing 10 mass % of diisopropylperoxy dicarbonate in R113, were introduced, whereupon the temperature was raised to 40° C. to initiate the polymerization. After the reaction for 5 hours, the autoclave was cooled to room temperature, and then, the polymer solution was taken out. The obtained polymer solution was put into methanol to precipitate the polymer, which was washed and then vacuum-dried at 50° C. to obtain 9.8 g of a fluoropolymer.

The composition of the obtained polymer was such that monomer 3 units/monomer 4 units=34/66 (mol %). The molecular weight of the obtained polymer was measured by GPC, whereby the number average molecular weight as calculated as polystyrene was 7500.

Preparation Example 3

Into a deaerated stainless steel autoclave having an internal capacity of 0.2 l and equipped with a stirrer, 150 g of R113 and 1.5 g of potassium carbonate were charged, and 24.3 g of monomer 1, 25.3 g of $CH_2$=$CHOC(CH_3)_3$ (hereinafter referred to simply as monomer 5) and 10 ml of a solution containing 10 mass % of diisopropylperoxy dicarbonate in R113, were introduced, whereupon the temperature was raised to 40° C. to initiate the polymerization. After the reaction for 7 hours, the autoclave was cooled to room temperature, and then, the polymer solution was taken out. The obtained polymer solution was put into methanol to precipitate the polymer, which was washed and then vacuum-dried at 50° C. to obtain 15.8 g of a fluoropolymer.

The composition of the obtained polymer was such that monomer 1 units/monomer 5 units=30/70 (mol %). The molecular weight of the obtained polymer was measured by GPC, whereby the number average molecular weight as calculated as polystyrene was 11500.

Preparation Example 4

Into a deaerated stainless steel autoclave having an internal capacity of 0.2 l and equipped with a stirrer, 150 g of R113 was charged, and 23.6 g of monomer 1, 19.1 g of vinyl acetate, and 10 ml of a solution containing 10 mass % of diisopropylperoxy dicarbonate in R113, were introduced, whereupon the temperature was raised to 40° C. to initiate the polymerization. After the reaction for 5 hours, the autoclave was cooled to room temperature, and then, the polymer solution was taken out. The obtained polymer solution was put into methanol to precipitate the polymer, which was washed and then vacuum-dried at 50° C. to obtain 5.5 g of a fluoropolymer.

The composition of the obtained polymer was such that monomer 1 units/vinyl acetate units=38/62 (mol %). The molecular weight of the obtained polymer was measured by GPC, whereby the number average molecular weight as calculated as polystyrene was 9200.

3 g of the polymer was dissolved in 30 g of tetrahydrofuran and mixed with 25 ml of an ethanol solution containing 10 mass % of sodium hydroxide, followed by stirring at room temperature for 48 hours, whereupon the mixture was neutralized with dilute hydrochloric acid. After confirming disappearance of carbonyl groups and formation of hydroxyl groups by the IR spectrum, the polymer was isolated and dried.

Then, 3 g of the polymer was dissolved in 10 g of N,N-dimethylacetoamide, and 4.6 g of di-tert-butyl dicarbonate was added to this solution, followed by stirring to completely dissolve it. Then, while stirring, 2.1 g of triethylamine was dropwise added over a period of about one minute. After completion of the dropwise addition, the mixture was stirred for about three hours. Then, to the obtained solution, twenty times of pure water was added, followed by stirring to precipitate a fluoropolymer having hydroxyl groups substituted by tert-butoxy carbonyloxy groups. The precipitate was washed with pure water, dehydrated and dried to obtain 5.1 g of a fluoropolymer having hydroxyl groups substituted by tert-butoxy carbonyloxy groups.

Preparation Examples 5 and 6

A fluoropolymer was prepared in the same manner as in Preparation Example 1 except that using monomer 1 and monomer 2, the charging ratio was changed as shown in Table 1. The amount of the obtained polymer, the compositional ratio of the units of monomer 1 to the units of monomer 2 in the polymer (represented by the molar ratio of units of monomer 1/units of monomer 2), and the molecular weight of the obtained polymer, are shown in Table 1.

TABLE 1

|  | Monomer 1 | Monomer 2 | Amount of polymer | Compositional ratio | Molecular weight |
|---|---|---|---|---|---|
| Preparation Example 5 | 33.0 g | 15.2 g | 5.0 g | 49/51 | 4800 |
| Preparation Example 6 | 14.2 g | 35.4 g | 4.1 g | 31/69 | 6200 |

Example 1

100 parts by mass of the fluoropolymer prepared in Preparation Example 1 and 5 parts by mass of trimethyl sulfonium triflate were dissolved in 700 parts by mass of propylene glycol monomethyl ether acetate, followed by filtration by means of a PTFE filter having a pore diameter of 0.1 μm to obtain a resist composition. The above resist composition was spin-coated on a silicon substrate treated with hexamethyldisilazane, followed by heat treatment at 80° C. for 2 minutes to form a resist film having a thickness of 0.3 μm. The absorption spectrum of this film was measured by an ultraviolet visible light photometer, whereby the transmittance at 193 nm was 72%. In an exposure test apparatus flushed with nitrogen, the substrate having the above resist film formed, was placed, and a mask having a pattern drawn by chromium on a quartz plate, was put thereon in close contact therewith. ArF laser beams were irradiated through the mask, whereupon, after exposure at 100° C. for two minutes, baking was carried out. The development was carried out at 23° C. for 3 minutes with a tetramethylammonium hydroxide aqueous solution (0.15 mass %) and then washing was carried out for one minute with pure water. As a result, at an exposure of 20 mJ/cm$^2$, only the exposed portion of the resist film was dissolved and removed by the developer, whereby a positive 0.25 μm line and space pattern was obtained.

Examples 2 to 6

These examples were carried out in the same manner as in Example 1 by using the fluoropolymers prepared in Preparation Examples 2 to 6. The results are shown in Table 2.

TABLE 2

| | Fluoropolymer | Transmittance | Sensitivity | Resolution | Developability |
|---|---|---|---|---|---|
| Ex. 2 | Preparation example 2 | 78 | 20 | 0.25 | Good |
| Ex. 3 | Preparation example 3 | 78 | 25 | 0.23 | Good |
| Ex. 4 | Preparation example 4 | 65 | 22 | 0.22 | Good |
| Ex. 5 | Preparation example 5 | 71 | 18 | 0.25 | Good |
| Ex. 6 | Preparation example 6 | 68 | 22 | 0.19 | Good |

Example 7

Etching resistance of the resist films of Examples 1 to 6 was measured. The results are shown in Table 3.

TABLE 3

| Resist films | Etching resistance |
|---|---|
| Ex. 1 | ○ |
| Ex. 2 | ◎ |
| Ex. 3 | ◎ |
| Ex. 4 | ○ |
| Ex. 5 | ○ |
| Ex. 6 | ◎ |

Etching resistance: the etching rate was measured by an argon/octafluorocyclobutane/oxygen mixed gas plasma, whereby when a novolac resin is rated to be 1, one with a rate of less than 1.2 is represented by ◎, one with a rate of more than 1.2 and less than 1.5 is representd by ○, and one with a rate of more than 1.5 is represented by x.

INDUSTRIAL APPLICABILITY

The resist composition of the present invention is excellent in dry etching properties and in transparency particularly to short wavelength ultraviolet rays, as a chemical amplification type resist and is capable of readily forming a resist pattern excellent in sensitivity, resolution, evenness, heat resistance, etc.

The entire disclosures of Japanese Patent Application No. 2000-185608 filed on Jun. 21, 2000 and Japanese Patent Application No. 2000-364489 filed on Nov. 30, 2000 including specifications, claims and summaries are incorporated herein by reference in their entireties.

What is claimed is:

1. A resist composition which comprises a fluoropolymer (A) having repeating units represented by a structure formed by the cyclopolymerization of one molecule of a fluorinated diene and one molecule of a monoene, in which the monoene unit in each repeating unit has a blocked acid group capable of regenerating the acid group by the action of an acid, an acid-generating compound (B) which generates an acid upon irradiation with light, and an organic solvent (C).

2. The resist composition according to claim 1, wherein the blocked acid group is a 1-hydroxy-1-trifluoromethyl-2,2,2-trifluoroethyl group having the hydroxyl group blocked, or a 1-hydroxy-1-methyl-2,2,2-trifluoroethyl group having the hydroxyl group blocked.

3. The resist composition according to claim 1, wherein the blocked acid group is a blocked hydroxyl group bonded directly to a carbon atom derived from the polymerizable unsaturated group of the monoene.

4. The resist composition according to claim 1, wherein the fluorinated diene is a compound represented by the formula (1):

$$CF_2=CF-X-CF=CF_2 \qquad (1)$$

wherein X is a bivalent atom such as an oxygen atom, or a $C_{1-3}$ perfluoroalkylene group.

5. The resist composition according to claim 4, wherein the fluorinated diene is a compound represented by the formula (1—1) or (1-2):

$$CF_2=CFCF_2CF=CF_2 \qquad (1—1)$$

$$CF_2=CFOCF=CF_2 \qquad (1-2).$$

6. The resist composition according to claim 1, wherein the monoene is a vinyl compound represented by $CH_2=CH-Y$ (wherein Y is a monovalent organic group having a blocked acid group or a group which can be converted to a blocked acid group, or a blocked acid group or a group which can be converted to a blocked acid).

7. The resist composition according to claim 1, wherein the fluoropolymer (A) is a fluoropolymer obtainable by the cyclopolymerization of a fluorinated diene and a monoene which has a 1-hydroxy-1-trifluoromethyl-2,2,2-trifluoroethyl group having the hydroxyl group blocked or a 1-hydroxy-1-methyl-2,2,2-trifluoroethyl group having the hydroxyl group blocked.

8. The resist composition according to claim 1, wherein the fluoropolymer (A) is a fluoropolymer obtainable by cyclopolymerizing a fluorinated diene and vinyl carboxylate or vinylene carboxylate, subjecting the obtained polymer to a hydrolytic reaction, and then blocking hydroxyl groups formed in the polymer with groups capable of regenerating the hydroxyl groups by the action of an acid.

9. The resist composition according to claim 1, wherein the fluoropolymer (A) is a flubropolymer obtainable by the cyclopolymerization of a fluorinated diene and a tert-alkyl vinyl ether.

10. The resist composition according to claim 1, wherein the acid-generating compound (B) which generates an acid upon irradiation with light, is an onium salt.

* * * * *